United States Patent
Lu et al.

(10) Patent No.: US 10,217,407 B2
(45) Date of Patent: Feb. 26, 2019

(54) DRIVING SYSTEM OF OLED DISPLAY PANEL, AND STATIC IMAGE PROCESSING METHOD

(71) Applicant: Shenzhen China Star Optoelectronics Technology Co., Ltd., Shenzhen (CN)

(72) Inventors: Po Yen Lu, Shenzhen (CN); Tai Jiun Hwang, Shenzhen (CN); Jianhang Fu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 97 days.

(21) Appl. No.: 15/328,509

(22) PCT Filed: Jan. 10, 2017

(86) PCT No.: PCT/CN2017/070741
§ 371 (c)(1),
(2) Date: Jan. 24, 2017

(87) PCT Pub. No.: WO2018/036090
PCT Pub. Date: Mar. 1, 2018

(65) Prior Publication Data
US 2018/0204509 A1   Jul. 19, 2018

(30) Foreign Application Priority Data
Aug. 24, 2016   (CN) .......................... 2016 1 0715830

(51) Int. Cl.
*G09G 3/34*   (2006.01)
*G09G 3/3233*   (2016.01)
(Continued)

(52) U.S. Cl.
CPC ......... *G09G 3/3233* (2013.01); *G09G 3/3225* (2013.01); *G09G 3/3258* (2013.01);
(Continued)

(58) Field of Classification Search
CPC .. G09G 3/3233; G09G 3/3406; G09G 3/3258; G09G 3/3225; G09G 2340/0464;
(Continued)

(56) References Cited

U.S. PATENT DOCUMENTS

2006/0066554 A1   3/2006   Baba
2010/0123648 A1   5/2010   Miller
(Continued)

FOREIGN PATENT DOCUMENTS

CN   1756299 A   4/2006
CN   101615374 A   12/2009
(Continued)

OTHER PUBLICATIONS

English translation of ISR in related PCT/CN2017/070741 issued by WIPO on May 17, 2017.
(Continued)

*Primary Examiner* — Abhishek Sarma

(57) ABSTRACT

A driving system of an OLED display panel and a static image processing method are disclosed. The method includes steps of: detecting a static image on the OLED display panel; classifying a detected static image according to image features; and selecting a corresponding processing mode according to the static image after classification so as to reduce an afterimage. According to the present disclosure, the afterimage on the display panel can be reduced.

8 Claims, 4 Drawing Sheets

(51) Int. Cl.
*G09G 3/3258* (2016.01)
*H01L 27/32* (2006.01)
*H01L 51/56* (2006.01)
*G09G 3/3225* (2016.01)

(52) U.S. Cl.
CPC ....... *G09G 3/3406* (2013.01); *H01L 27/3232* (2013.01); *H01L 51/56* (2013.01); *G09G 2320/046* (2013.01); *G09G 2320/103* (2013.01); *G09G 2340/0464* (2013.01)

(58) Field of Classification Search
CPC ........ G09G 2320/103; G09G 2320/046; H01L 51/56; H01L 27/3232
See application file for complete search history.

(56) References Cited

U.S. PATENT DOCUMENTS

| | | | | |
|---|---|---|---|---|
| 2011/0227961 | A1* | 9/2011 | Kikuta | G09G 3/3225 345/690 |
| 2014/0049566 | A1 | 2/2014 | Sudou | |
| 2014/0152630 | A1 | 6/2014 | Koyama | |

FOREIGN PATENT DOCUMENTS

| | | |
|---|---|---|
| CN | 101827259 A | 9/2010 |
| CN | 101666610 A | 10/2010 |
| CN | 102194409 A | 9/2011 |
| CN | 102308331 A | 1/2012 |
| CN | 103152612 A | 6/2013 |
| CN | 103595897 A | 2/2014 |
| CN | 104766561 A | 7/2015 |
| JP | 2007304318 A | 11/2007 |
| WO | 2016/169275 A1 | 10/2016 |

OTHER PUBLICATIONS

Machine translation of CN101615374A by Lexis Nexis Total Patent on Aug. 9, 2018 (27 pages).
Machine translation of CN101827259A by Lexis Nexis Total Patent on Aug. 9, 2018 (16 pages).
Machine translation of CN101866610A by Lexis Nexis Total Patent on Aug. 9, 2018 (20 pages).
Machine translation of CN103152512A by Lexis Nexis Total Patent on Aug. 9, 2018 (20 pages).
Machine translation of JP2007304318A by Lexis Nexis Total Patent on Aug. 9, 2018 (27 pages).
Written opinion issued in related PCT/CN2017/070741 by WIPO dated May 17, 2017.

* cited by examiner

DRIVING SYSTEM OF OLED DISPLAY PANEL, AND STATIC IMAGE PROCESSING METHOD

CROSS-REFERENCE TO RELATED APPLICATIONS

The present application claims the priority of Chinese patent application CN201610715830.1, entitled "Driving system of OLED display panel and static image processing method" and filed on Aug. 24, 2016, the entirety of which is incorporated herein by reference.

FIELD OF THE INVENTION

The present disclosure relates to the technical field of organic display control, and particularly to a driving system of an OLED display panel and a static image processing method.

BACKGROUND OF THE INVENTION

At present, most OLEDs (Organic Light-Emitting Diodes) are driven by direct current. Holes in an OLED enter into a light-emitting layer thereof from an anode, and electrons enter into the light-emitting layer from a cathode. The holes and the electrons recombine with each other in the light-emitting layer, and thus light can be emitted.

FIG. 1 is a schematic diagram of a circuit structure of pixels in an OLED display screen in the prior art. When a scanning line (Gate) corresponding to a row of pixels outputs a scanning signal, a transistor T1 is turned on. At this time, a driving signal output by a data line Data charges a capacitor C. A voltage of the capacitor C is taken as a gate voltage of a transistor T2. The on/off state of the transistor T2 can be controlled by the voltage of the capacitor C, and thus a magnitude of current flowing through the OLED can be controlled. When the OLED display screen operates, all of the pixels are kept continuously in the light-emitting state.

With the increase of the usage time of the OLED display screen, holes and electrons can accumulate on the interfaces of their respective transmission layers and light-emitting layers, thereby forming a built-in electric field in the OLED. This built-in electric field can increase a threshold voltage of the OLED, thus reducing its brightness. For OLED panels, due to the existence of built-in electric fields, an afterimage can easily appear on some static display areas thereof (e.g., TV station captions or advertisements displayed for a long time).

SUMMARY OF THE INVENTION

In order to solve the above problem, the present disclosure provides a driving system of an OLED display panel and a static image processing method to reduce an afterimage on the display panel.

According to one aspect, the present disclosure provides a static image processing method for an OLED display panel. The method comprises:
  detecting a static image on the OLED display panel;
  classifying a detected static image according to image features; and
  selecting a corresponding processing mode according to the static image after classification so as to reduce an afterimage.

According to an embodiment of the present disclosure, the step of detecting a static image on the OLED display panel further comprises:
  extracting an image profile of a display frame; and
  calculating a number of frames having a same image profile, wherein if the number of frames having the same image profile exceeds a preset value, it is determined that a static image appears on the display panel.

According to an embodiment of the present disclosure, when the static image is classified as one having elongated edges, a processing mode of displacing the static image is adopted.

According to an embodiment of the present disclosure, the processing mode of displacing the static image comprises moving the static image along various directions of the display panel.

According to an embodiment of the present disclosure, when the static image is classified as one having a large-area, a processing mode of reducing a brightness of pixels is adopted.

According to an embodiment of the present disclosure, the method further comprises following steps before the step of selecting the corresponding processing mode according to the static image after classification:
  determining, after it is determined that the static image appears on the display panel, whether the static image has been processed, wherein,
  if yes, invoking and optimizing the processing mode of the static image; and
  if no, classifying the static image and selecting the corresponding processing mode.

According to another aspect, the present disclosure provides a driving system of an OLED display panel, which comprises:
  a timing controller for processing image data into output image data and a timing control signal;
  a data driver connected with the timing controller for converting the output image data into a data driving signal and outputting it to a display panel; and
  a scanning driver connected with the timing controller converting the timing control signal into a scanning driving signal and outputting it to the display panel,
  wherein the display panel further comprises a static image processor, which is connected with the timing controller for outputting an input original static image to the timing controller after conducting corresponding processing on the input original static image so as to reduce an afterimage.

According to an embodiment of the present disclosure, the static image processor comprises:
  a detection unit for detecting an input image so as to determine the static image on the display panel;
  a control unit connected with the detection unit for classifying the detected static image according to image features; and
  an image data processing unit connected with the control unit for processing an original image according to a classification result for the static image of the control unit and outputting a processed image for panel display.

According to an embodiment of the present disclosure, the static image processor is disposed in the timing controller.

According to an embodiment of the present disclosure, the static image processor is independently disposed in the driving system.

The following beneficial effects can be brought about according to the present disclosure.

When a static image is displayed on some area of a panel, a light-emitting time of the OLED for which a same image needs to be displayed for a long time is shortended, and thus the occurrence of an afterimage can be reduced.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
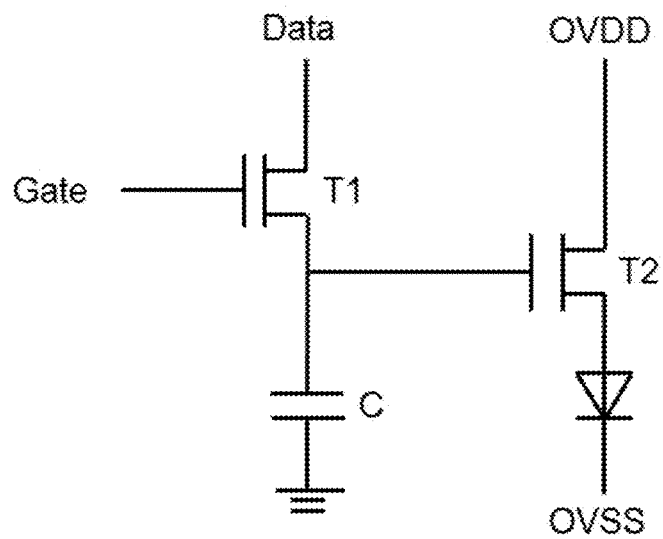
FIG. 1 is a schematic diagram of a structure of an OLED direct current drive circuit in the prior art.
Figure 2:
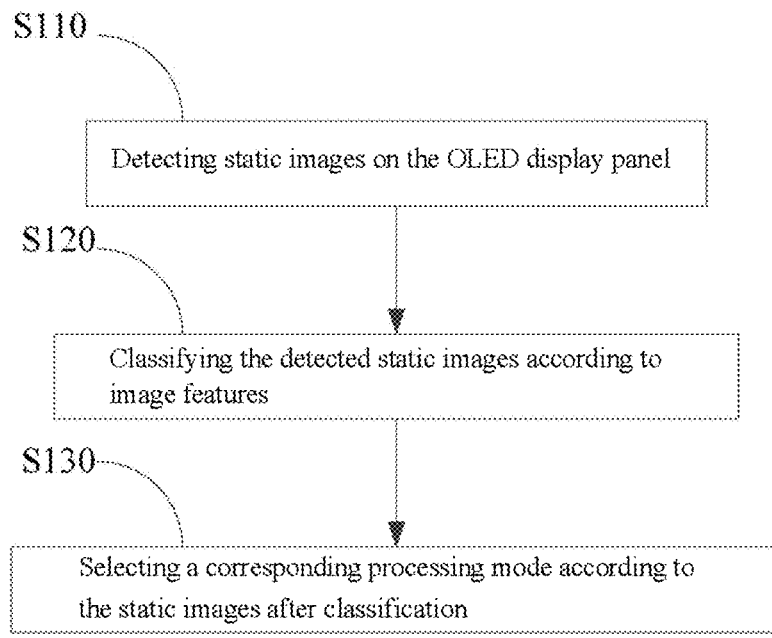
FIG. 2 is a flow chart of a method according to an embodiment of the present disclosure.
Figure 3:
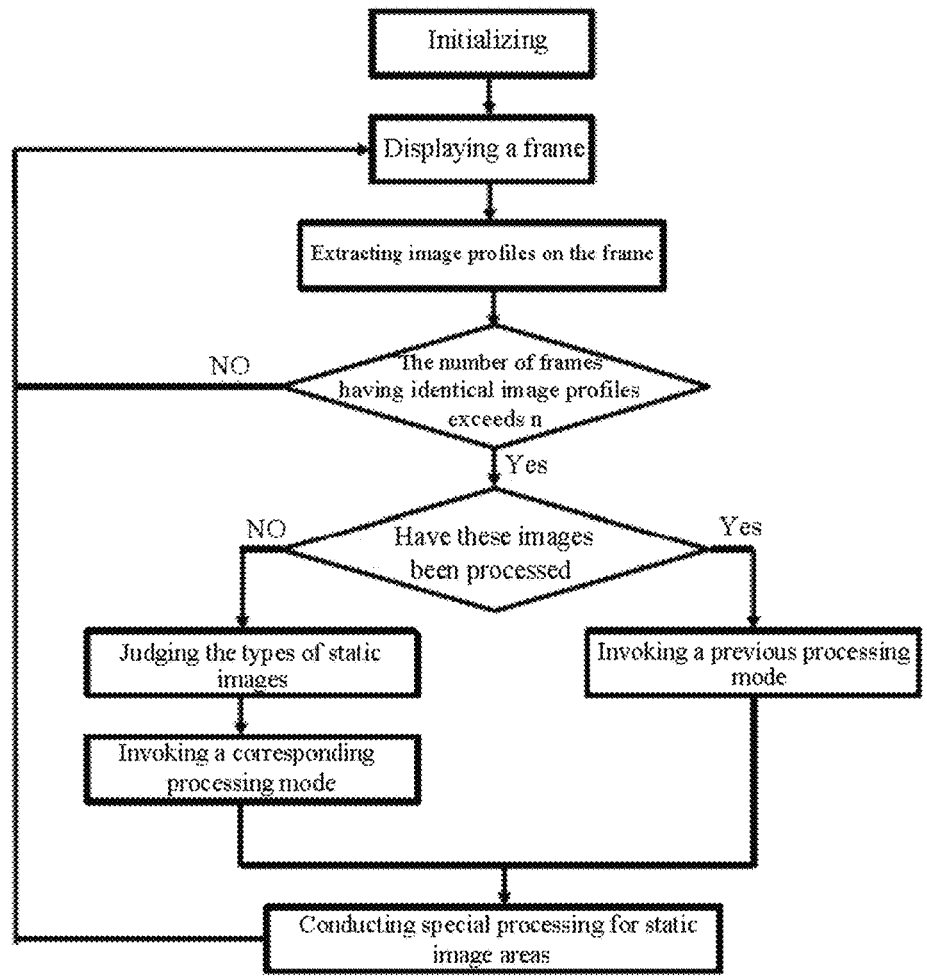
FIG. 3 is a flow chart of an algorithm according to an embodiment of the present disclosure.

FIG. 2 is a flow chart of a method according to an embodiment of the present disclosure, and FIG. 3 is a flow chart of an algorithm according to an embodiment of the present disclosure. The present disclosure will be described below in detail with reference to FIGS. 2 and 3.

First, in step S110, a static image on an OLED display panel is detected. Specifically, as shown in FIG. 3, after a display frame appears, image profiles on the frame are extracted. After that, the number of frames having identical image profiles is calculated. If the number of frames having identical image profiles exceeds a preset value n, it is determined that a static image appears on the display panel.

Figure 4:
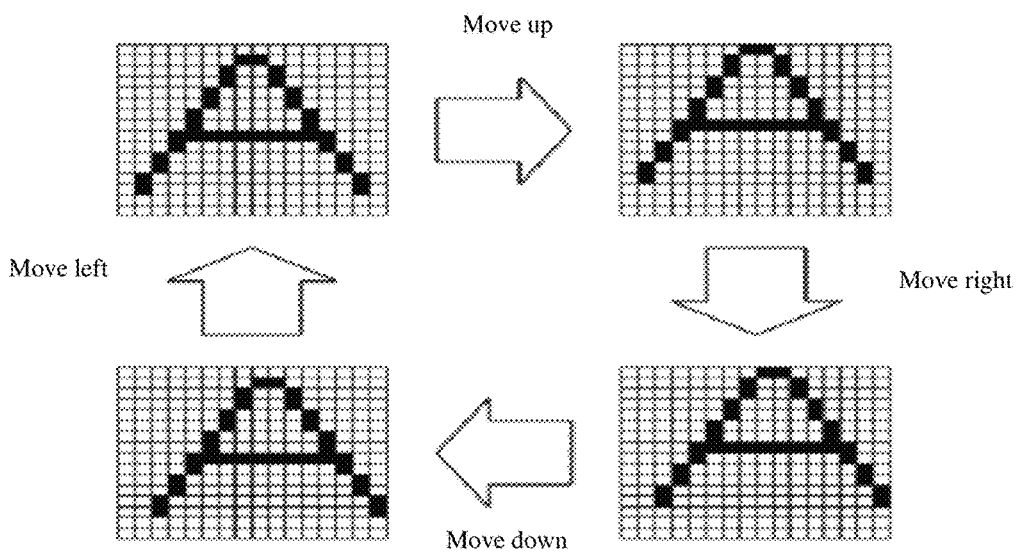
FIG. 4 is a schematic diagram of a static image processing mode according to an embodiment of the present disclosure.
Figure 5A:
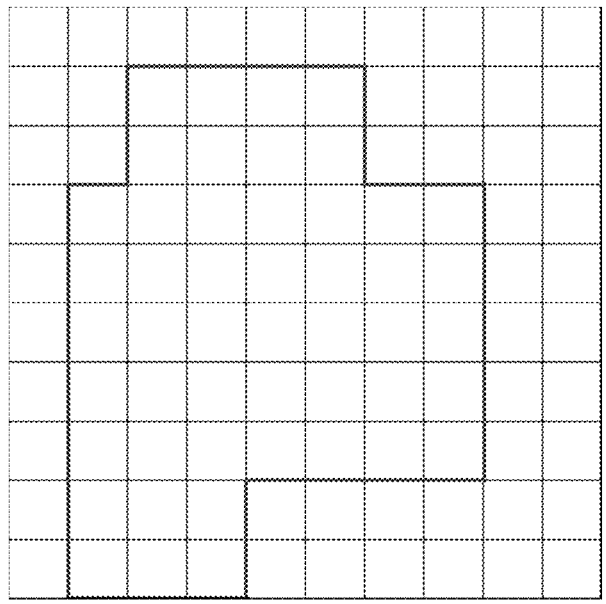
FIGS. 5a-5b are schematic diagrams of a static image processing mode according to another embodiment of the present disclosure.
Figure 5B:
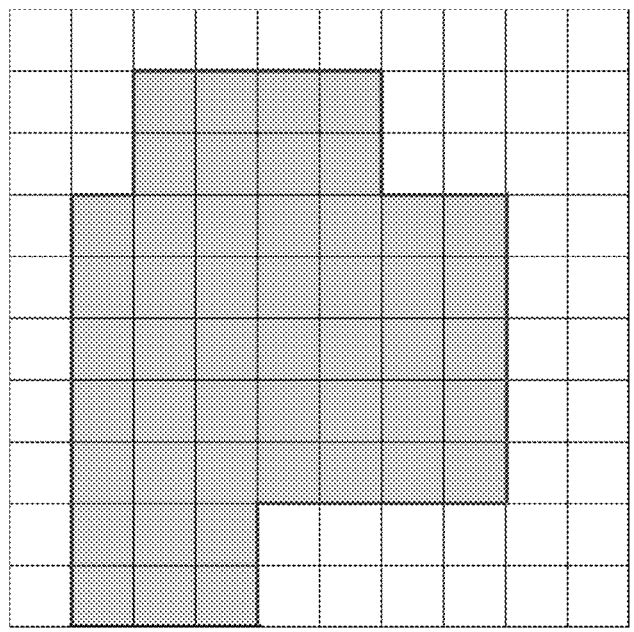

Then, in step S120, the detected static image is classified according to image features. Specifically, different static images have different features in terms of locations, brightness and other information. Therefore, the static image can be classified based on these different image features. For example, some static images are large-area images (as shown in the images of FIGS. 5a-5b, a large area represents that these static images occupy a large proportion of the screen, which reaches a certain proportion with respect to the display screen), while other static images are images having elongated edges (as shown in FIG. 4), etc. Since there are various kinds of static images, processing modes for various kinds of static images are also different. Examples are too numerous to be exhaustively listed, and only four images in FIG. 4 and two images in FIGS. 5a-5b are taken as examples for illustration. However, the present disclosure is not limited by this.

Eventually, in step S130, a corresponding processing mode is selected according to the static images after classification so as to reduce an afterimage. Specifically, different processing modes are selected based on different categories of static images. For example, when the static image is classified as one having elongated edges, the processing mode of displacing the static image can be adopted. This processing mode comprises moving the static image along various directions of the display panel. It is defined that each grid in FIG. 4 represents one pixel. As shown in the four images in FIG. 4, static areas are found mainly on elongated edges. With respect to such a static image, it can be slightly moved along upper, lower, right and left directions in a continuous manner to avoid the afterimage caused by pixels displaying the same information for a long time.

When the static image is classified as one having a large-area, a processing mode of reducing a brightness of pixels is adopted. As shown in FIGS. 5a-5b, the blocks bordered by bold lines represent the static area. For such large-area static image, the method of properly reducing the brightness of pixels can be adopted to delay the appearance of an afterimage, and decrease a deterioration speed of the afterimage.

The principle of the above image processing methods for FIG. 4 and FIGS. 5a-5b is that a light-emitting time of the OLED for which a same image needs to be displayed for a long time is shortened so as to reduce the occurrence of the afterimage.

According to an embodiment of the present disclosure, the method further comprises following steps before the step of selecting the corresponding processing mode according to the static image after classification. After it is determined that the static image appears on the display panel, whether the static image has been processed is determined. If a determination result is yes, the processing mode of the static image is invoked and optimized. If the determination result is no, the static image is classified and the corresponding processing mode is selected.

When a static image is displayed on some area of a panel, a light-emitting time of the OLED for which a same image needs to be displayed for a long time is shortended, and thus the occurrence of the afterimage can be reduced.

Figure 6:
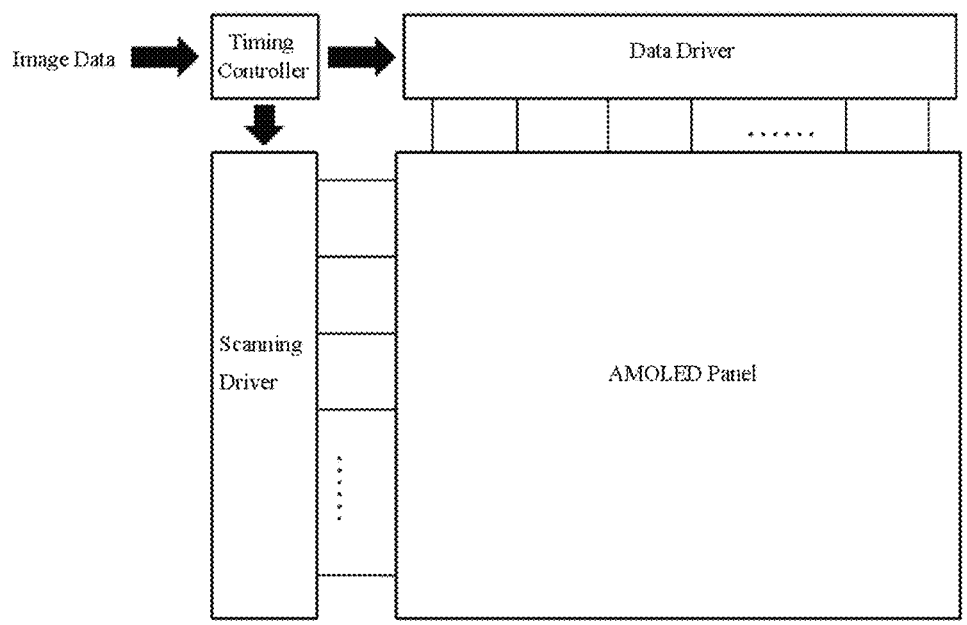
FIG. 6 is a schematic diagram of a structure of a driving system of a display panel according to an embodiment of the present disclosure.

According to another aspect of the present disclosure, a driving system of the OLED display panel is further provided. The driving system comprises a timing controller, a data driver and a scanning driver. As shown in FIG. 6, the timing controller is connected respectively with the data driver and the scanning driver. The timing controller processes image data into output image data and a timing control signal, outputs the output image data to the data driver, and outputs the timing control signal to the scanning driver. Here, the display panel further comprises a static image processing module, wherein the static image processing module is connected with the timing controller for outputting an input original static image to the timing controller after conducting corresponding processing on the input original static image so as to reduce the occurrence of the afterimage.

Figure 7:
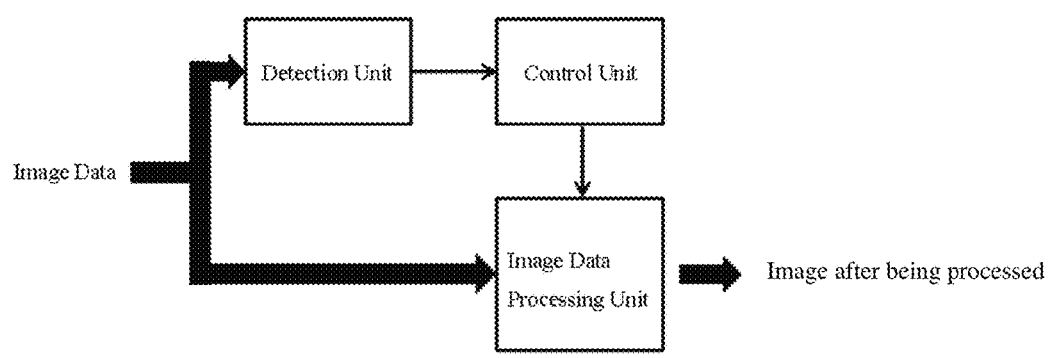
FIG. 7 is a schematic diagram of a structure of a static processing module according to an embodiment of the present disclosure.

According to an embodiment of the present disclosure, the static image processor comprises a detection unit, a control unit and an image data processing unit, as shown in FIG. 7. Here, the detection unit is used for detecting an input image so as to determine static image on a display panel. The control unit is connected with the detection unit for classifying the detected static image according to image features, and the processing method to be used for the static image depends on its classification. The image processing unit is connected with the control unit for processing an original image according to a classification result for the static image of the control unit and outputting a processed image for panel display.

According to one embodiment of the present disclosure, the static image processor is disposed in the timing controller. Specifically, the static image processor is disposed at a front end of the timing controller. Image data enters into the module first, and is then output to other circuits of the timing controller after being processed. According to another embodiment of the present disclosure, the static image processor is independently disposed in the driving system, and located before the timing controller. Original image data enters this module first, and the image data is then output to the timing controller after being processed. Of course, the static image processor can also be disposed at other positions in the driving system, and the present disclosure is not limited by this.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A driving system of an OLED display panel, comprising:
   a timing controller for processing image data into output image data and a timing control signal;
   a data driver connected with the timing controller for converting the output image data into a data driving signal and outputting it to a display panel; and
   a scanning driver connected with the timing controller converting the timing control signal into a scanning driving signal and outputting it to the display panel,
   wherein the display panel further comprises a static image processor, which is connected with the timing controller for outputting an input original static image to the timing controller after conducting corresponding processing on the input original static image so as to reduce an afterimage, the static image processor comprising:
   a detection unit for detecting an input image so as to determine the static image on the display panel;
   a control unit connected with the detection unit for classifying the detected static image according to image features; and
   an image data processing unit connected with the control unit for processing an original image according to a classification result for the static image of the control unit and outputting a processed image for panel display,
   wherein the control unit is configured for determining, after it is determined by the detection unit that the static image appears on the display panel, whether the static image has been processed, wherein,
   if yes, the image data processing unit is configured for invoking and optimizing the processing mode of the static image; and
   if no, the image data processing unit is configured for classifying the static image and selecting the corresponding processing mode.

2. The driving system of claim 1, wherein the static image processor is disposed in the timing controller.

3. The driving system of claim 1, wherein the static image processor is independently disposed in the driving system.

4. A static image processing method for an OLED display panel, comprising steps of:
   detecting a static image on the OLED display panel;
   classifying a detected static image according to image features;
   selecting a corresponding processing mode according to the static image after classification so as to reduce an afterimage, and
   before the step of selecting the corresponding processing mode according to the static image after classification:
   determining, after it is determined that the static image appears on the display panel, whether the static image has been processed, wherein,
   if yes, invoking and optimizing the processing mode of the static image; and
   if no, classifying the static image and selecting the corresponding processing mode.

5. The processing method of claim 4, wherein the step of detecting a static image on the OLED display panel further comprises:
   extracting an image profile of a display frame; and
   calculating a number of frames having a same image profile, wherein if the number of frames having the same image profile exceeds a preset value, it is determined that a static image appears on the display panel.

6. The processing method of claim 4, wherein when the static image is classified as one having elongated edges, a processing mode of displacing the static image is adopted.

7. The processing method of claim 6, wherein the processing mode of displacing the static image comprises moving the static image along various directions of the display panel.

8. The processing method of claim 4, wherein when the static image is classified as one having a large-area, a processing mode of reducing a brightness of pixels is adopted.

* * * * *